US008697485B2

(12) United States Patent
Crain et al.

(10) Patent No.: US 8,697,485 B2
(45) Date of Patent: Apr. 15, 2014

(54) PRINTED ELECTRONICS

(75) Inventors: John M. Crain, Washington, DC (US); John S. Lettow, Washington, DC (US); Ilhan A. Aksay, Princeton, NJ (US); Sibel A. Korkut, Princeton, NJ (US); Katherine S. Chiang, Princeton, NJ (US); Chuan-Hua Chen, Princeton, NJ (US); Robert K. Prud'Homme, Princeton, NJ (US)

(73) Assignees: Vorbeck Materials Corporation, Jessup, MD (US); The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 13/603,818

(22) Filed: Sep. 5, 2012

(65) Prior Publication Data
US 2013/0033810 A1 Feb. 7, 2013

Related U.S. Application Data

(62) Division of application No. 12/866,079, filed as application No. PCT/US2009/030570 on Jan. 9, 2009, now Pat. No. 8,278,757.

(60) Provisional application No. 61/026,273, filed on Feb. 5, 2008.

(51) Int. Cl.
*H01L 51/40* (2006.01)

(52) U.S. Cl.
USPC 438/99; 438/119; 257/E23.018; 257/E23.075; 257/E23.166; 257/E21.299; 156/277

(58) Field of Classification Search
USPC ............. 257/E23.018, E23.075, E23.166, 257/E21.299; 438/99, 119; 156/277
See application file for complete search history.

(56) References Cited

U.S. PATENT DOCUMENTS

| | | | |
|---|---|---|---|
| 6,350,795 B1 | 2/2002 | Breton et al. |
| 7,658,901 B2 | 2/2010 | Prud'Homme et al. |
| 7,659,350 B2 | 2/2010 | Prud'Homme et al. |
| 7,745,528 B2 | 6/2010 | Prud'Homme et al. |
| 7,763,187 B1 | 7/2010 | Veedu et al. |
| 7,771,824 B2 | 8/2010 | Herrera-Alonso et al. |
| 7,935,754 B2 | 5/2011 | Prud'Homme et al. |
| 8,047,248 B2 | 11/2011 | Prud'Homme et al. |

(Continued)

FOREIGN PATENT DOCUMENTS

| | | |
|---|---|---|
| JP | 63-278396 | 11/1988 |
| JP | 64-57696 | 3/1989 |

(Continued)

OTHER PUBLICATIONS

Office Action issued Jan. 15, 2013 in Japanese Application No. 2010-545911 (With English Translation).

(Continued)

*Primary Examiner* — Jasmine Clark
(74) *Attorney, Agent, or Firm* — Oblon, Spivak, McClelland, Maier & Neustadt, L.L.P.

(57) ABSTRACT

Printed electronic device comprising a substrate onto at least one surface of which has been applied a layer of an electrically conductive ink comprising functionalized graphene sheets and at least one binder. A method of preparing printed electronic devices is further disclosed.

20 Claims, 1 Drawing Sheet

(56) References Cited

U.S. PATENT DOCUMENTS

| | | |
|---|---|---|
| 8,048,214 B2 | 11/2011 | Prud'Homme et al. |
| 8,048,931 B2 | 11/2011 | Prud'Homme et al. |
| 8,048,950 B2 | 11/2011 | Prud'Homme et al. |
| 8,053,508 B2 | 11/2011 | Korkut et al. |
| 8,063,134 B2 | 11/2011 | Prud'Homme et al. |
| 8,066,964 B2 | 11/2011 | Prud'Homme et al. |
| 8,105,976 B2 | 1/2012 | Prud'Homme et al. |
| 8,110,026 B2 | 2/2012 | Prud'Homme et al. |
| 8,110,524 B2 | 2/2012 | Prud'Homme et al. |
| 8,192,870 B2 | 6/2012 | Aksay et al. |
| 8,278,757 B2 * | 10/2012 | Crain et al. ............ 257/746 |
| 2007/0092432 A1 | 4/2007 | Prud'Homme et al. |
| 2008/0008822 A1 | 1/2008 | Kowalski et al. |
| 2008/0302561 A1 | 12/2008 | Prud'Homme et al. |
| 2008/0312368 A1 | 12/2008 | Prud'Homme et al. |
| 2009/0053433 A1 | 2/2009 | Prud'Homme et al. |
| 2009/0053437 A1 | 2/2009 | Prud'Homme et al. |
| 2009/0054272 A1 | 2/2009 | Prud'Homme et al. |
| 2009/0054578 A1 | 2/2009 | Prud'Homme et al. |
| 2009/0054581 A1 | 2/2009 | Prud'Homme et al. |
| 2009/0123752 A1 | 5/2009 | Prud'Homme et al. |
| 2009/0123843 A1 | 5/2009 | Aksay et al. |
| 2009/0127514 A1 | 5/2009 | Korkut et al. |
| 2009/0233057 A1 | 9/2009 | Aksay et al. |
| 2010/0096595 A1 | 4/2010 | Prud'Homme et al. |
| 2011/0049437 A1 | 3/2011 | Crain et al. |
| 2011/0052813 A1 | 3/2011 | Ho et al. |
| 2011/0114897 A1 | 5/2011 | Aksay et al. |
| 2011/0178224 A1 | 7/2011 | Pan et al. |
| 2012/0088084 A1 | 4/2012 | Prud'Homme et al. |
| 2012/0145234 A1 | 6/2012 | Roy-Mayhew et al. |
| 2012/0255607 A1 | 10/2012 | Roy-Mayhew et al. |

FOREIGN PATENT DOCUMENTS

| | | |
|---|---|---|
| JP | 2004-351602 | 12/2004 |
| JP | 2005-327844 | 11/2005 |
| WO | WO 2007/047084 A2 | 4/2007 |

OTHER PUBLICATIONS

Extended Search Report issued Jun. 6, 2013 in European Patent Application No. 09709241.5.

* cited by examiner

PRINTED ELECTRONICS

STATEMENT REGARDING RELATED APPLICATIONS

The present application is a divisional of U.S. Ser. No. 12/866,079, filed Nov. 3, 2010, now U.S. Pat. No. 8,278,757, which was a 371 national stage application of PCT application PCT/US09/30570, filed Jan. 9, 2009, which claimed priority to U.S. Provisional application Ser. No. 61/026,273, filed Feb. 5, 2008, the entire contents of each of which are hereby incorporated by reference. The present application claims priority to each of the above listed applications.

This invention was made with Government support under Grant No. CMS-0609049, awarded by the National Science Foundation, and under Grant No. NCC1-02037, awarded by NASA. The Government has certain rights in the invention.

FIELD OF THE INVENTION

The present invention relates to printed electronic devices and methods for their manufacture.

BACKGROUND

Printed electronics are increasingly finding uses in a great variety of applications, including portable electronics, signage, lighting, product identification, packaging flexible electronic devices (such as those that can be rolled or bent), photovoltaic devices, medical and diagnostic devices, antennas (including RFID antennas), displays, sensors, thin-film batteries, electrodes and myriad others. Printed electronics have a variety of advantages over electronics made using other methods, including subtractive methods. Printing can be faster than normal subtractive methods (such as etching) and can generate less waste and involve the use of fewer hazardous chemicals than in such methods. The resulting electronics can be more facilely used in flexible devices, such as displays, that are designed to be rolled, twisted, bent, or subjected to other distortions during use.

Printed electronics are typically made by printing the electronic circuit or other component or device on a substrate using an electrically conductive metal-based ink. The inks typically contain silver particles, and occasionally copper particles, other metallic particles, and/or conductive polymers. However, conductive polymers alone are generally not sufficiently electrically conductive. Furthermore, the resulting printed metallic circuits are usually insufficiently electrically conductive to be effective in most applications, including in devices in which the circuits are regularly stressed by bending and/or stretching during use. The printed substrates must therefore often be heated at elevated temperatures to sinter the conductive metal particles in order to achieve the desired levels of electrical conductivity. The temperatures used in sintering processes frequently limit the substrates that can be selected for the preparation of the electronics. For example, while it would be desirable to use inexpensive materials such as paper, polyolefins (e.g., polypropylene), and the like as substrates for printed electronics in many applications, the sintering temperatures often required are too high to be used with paper.

Furthermore, silver is costly and other, non-precious, metals can form oxides upon exposure to the environment that can render the material insufficiently conductive for the application. Additionally, the use of metal-based inks can add weight to the resulting device, and the aforementioned sintering process can add one or more additional steps, time, and complexity to the fabrication process. It would thus be desirable to obtain printed electronic devices using inks that do not contain costly precious metals, that are lighter weight, and that do not require sintering to become sufficiently electrically conductive, and that could therefore be used on a wider variety of substrate materials, including paper and polyolefins such as polyethylene.

U.S. Pat. No. 7,097,788 discloses a method of increasing the conductivity of an ink comprising orienting particles in the ink. U.S. Pat. No. 7,163,734 discloses an element and a method for patterning an organic polymer electroconductive layer that is suitable as an electronic circuitry element in an electric or semiconductor device. US 2006/0124922 discloses an electrically conductive ink used to form electrodes for an organic semiconductor transistor. WO 2004/006635 discloses a method of printing using an electrically conductive ink. WO 2006/108165 discloses a conductive ink containing fine metallic particles, a polymer base, a solvent, and a nanotubes containing conductive filler. WO 2006/137666 discloses an antenna having an antenna radiator formed by printing electrically conductive ink on a substrate. WO 2007/053621 discloses a method of electrohydrodynamic printing and manufacturing.

SUMMARY OF THE INVENTION

Disclosed and claimed herein is a printed electronic device, comprising a substrate comprising at least one surface, wherein a layer of an electrically conductive ink has been applied to a portion of the surface, and wherein the ink comprises functionalized graphene sheets and at least one binder. Further disclosed and claimed herein is a method for forming the printed electronic device.

DESCRIPTION

Figure 1:
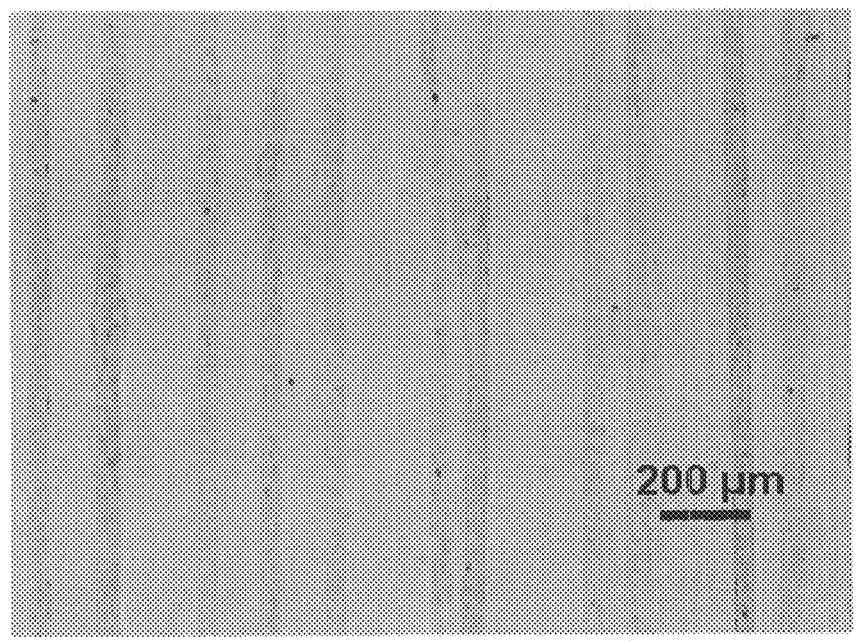
FIG. 1 is an optical microscope image of electrically conductive lines printed from an ink comprising functionalized graphene sheets embedded into poly(ethylene oxide).

As used herein, the term "electrically conductive ink" encompasses materials comprising electrically conductive materials suspended and/or dissolved in a liquid, as well as pastes and materials in substantially solid form containing little or no liquids. Electrically conductive inks may be free-flowing, viscous, solid, powdery, and the like. The term "ink" is used to refer to an ink in a form that is suitable for application to a substrate, as well as the material after it is applied to a substrate both before and after any post-application treatments (such as evaporation, cross-linking, curing etc.).

The printed electronic devices (also referred to herein as "printed electronics) of the present invention may be in the form of complete devices, parts or sub elements of devices, electronic components, and the like. They comprise a substrate onto at least one surface of which has been applied a layer of an electrically conductive ink comprising high surface area functionalized graphene sheets and at least one binder.

The printed electronics are prepared by applying the ink to a substrate in a pattern comprising an electrically conductive pathway designed to achieve the desired electronic device. The pathway may be solid, mostly solid, in a liquid or gel form, and the like. The ink may further optionally comprise a carrier other than a binder. When the ink has been applied to the substrate, all or part of the carrier may be removed to form the electrically conductive pathway. The binder may be cured or cross-linked after the ink has been applied to the substrate.

The printed electronic device formed from the application of the ink to the substrate may be optionally sintered or otherwise cured, which can result in the formation of direct bonds between the conducting particles and thus increase the number of conduction paths. In one embodiment of the invention, all or a portion of the device formed from the ink is not sintered and/or not otherwise cured.

To prepare the printed electronic device, the ink may be applied to the substrate using any suitable method, including, but not limited to, by syringe, spray coating, electrospray deposition, ink-jet printing, spin coating, thermal transfer (including laser transfer) methods, screen printing, rotary screen printing, gravure printing, capillary printing, offset printing, electrohydrodynamic (EHD) printing (a method of which is described in WO 2007/053621, which is hereby incorporated herein by reference), flexographic printing, pad printing, stamping, xerography, microcontact printing, dip pen nanolithography, laser printing, via pen or similar means, and the like.

The substrate may be any suitable material, including, for example, polymers, including thermoplastic and thermoset polymers; pulp products such as paper and cardboard (including coated and uncoated materials); synthetic papers; fabrics (including cloths) and textiles; metals; woods; glass and other minerals; silicon and other semiconductors; ceramics; laminates made from a variety of materials; and the like.

Examples of polymers include polyolefins (such as polyethylene, polypropylene, and the like); polyimides; polyesters (such as poly(ethylene terephthalate), poly(ethylene naphthalate), liquid crystalline polyesters, and the like); polyamides (including polyterephthalamides); aramids (such as Kevlar® and Nomex®); fluoropolymers (such as fluorinated ethylene propylene (FEP), polytetrafluoroethylene (PTFE), poly(vinyl fluoride), poly(vinylidene fluoride), and the like); polyetherimides; poly(vinyl chloride); poly(vinylidene chloride); polyurethanes; cellulosic polymers; SAN; ABS; polycarbonates; polyacrylates; thermoset epoxies and polyurethanes; and elastomers (including thermoplastics and thermosets, and including rubbers (such as natural rubber) and silicones).

The high surface area functionalized graphene sheets, which are also referred to herein as "FGS", are graphite sheets having a surface area of from about 300 to about 2630 $m^2/g$. In some embodiments of the present invention, the FGS primarily, almost completely, or completely comprise fully exfoliated single sheets of graphite (often referred to as "graphene), while in other embodiments, they may comprise partially exfoliated graphite sheets, in which two or more sheets of graphite have not been exfoliated from each other. The FGS may comprise mixtures of fully and partially exfoliated graphite sheets.

One method of obtaining graphene sheets is from graphite and/or graphite oxide (also known as graphitic acid or graphene oxide). Graphite may be treated with oxidizing and intercalating agents and exfoliated. Graphite may also be treated with intercalating agents and electrochemically oxidized and exfoliated. Graphene sheets may be formed by ultrasonically exfoliating suspensions of graphite and/or graphite oxide in a liquid. Exfoliated graphite oxide dispersions or suspensions can be subsequently reduced to graphene sheets. Graphene sheets may also be formed by mechanical treatment (such as grinding or milling) to exfoliate graphite or graphite oxide (which would subsequently be reduced to graphene sheets).

Reduction of graphite oxide to graphene may be by means of chemical reduction using hydrogen gas or other reducing agents. Examples of useful chemical reducing agents include, but are not limited to, hydrazines (such as hydrazine, N,N-dimethylhydrazine, etc.), sodium borohydride, hydroquinone, and the like. For example, a dispersion of exfoliated graphite oxide in a carrier (such as water, organic solvents, or a mixture of solvents) can be made using any suitable method (such as ultrasonication and/or mechanical grinding or milling) and reduced to graphene sheets.

In a preferred method, graphite is oxidized to graphite oxide, which is then thermally exfoliated to form high surface area FGS that are in the form of thermally exfoliated graphite oxide, as described in US 2007/0092432, the disclosure of which is hereby incorporated herein by reference. The thusly formed thermally exfoliated graphite oxide may display little or no signature corresponding to graphite or graphite oxide in its X-ray or electron diffraction patterns.

Graphite oxide may be produced by any method known in the art, such as by a process that involves oxidation of graphite using one or more chemical oxidizing agents and, optionally, intercalating agents such as sulfuric acid. Examples of oxidizing agents include nitric acid, sodium and potassium nitrates, perchlorates, hydrogen peroxide, sodium and potassium permanganates, phosphorus pentoxide, bisulfites, and the like. Preferred oxidants include $KClO_4$; $HNO_3$ and $KClO_3$; $KMnO_4$ and/or $NaMnO_4$; $KMnO_4$ and $NaNO_3$; $K_2S_2O_8$ and $P_2O_5$ and $KMnO_4$; $KMnO_4$ and $HNO_3$; and $HNO_3$. A preferred intercalation agent includes sulfuric acid. Graphite may also be treated with intercalating agents and electrochemically oxidized.

Exfoliation, including the exfoliation of graphite oxide is preferably carried out at temperatures of at least 220° C. or more, preferably at temperatures of from 220 to 3000° C.

The FGS used in the present invention preferably have a surface area of from about 300 to about 2630 $m^2/g$, or more preferably from about 350 to about 2400 $m^2/g$, or still more preferably of from about 400 to about 2400 $m^2/g$, or yet more preferably of from about 500 to about 2400 $m^2/g$. In another preferred embodiment, the surface area is about 300 to about 1100 $m^2/g$. A single graphite sheet has a maximum calculated surface area of 2630 $m^2/g$. The surface area includes all values and subvalues therebetween, especially including 400, 500, 600, 700, 800, 900, 100, 110, 1200, 1300, 1400, 1500, 1600, 1700, 1800, 1900, 2000, 2100, 2200, 2300, 2400, and 2500 $m^2/g$.

Surface area can be measured using either the nitrogen adsorption/BET method or, preferably, a methylene blue (MB) dye method.

The dye method is carried out as follows: A known amount of FGS is added to a flask. At least 1.5 g of MB are then added to the flask per gram of FGS. Ethanol is added to the flask and the mixture is ultrasonicated for about fifteen minutes. The ethanol is then evaporated and a known quantity of water is added to the flask to re-dissolve the free MB. The undissolved material is allowed to settle, preferably by centrifuging the sample. The concentration of MB in solution is determined using a UV-vis spectrophotometer by measuring the absorption at $\lambda_{max}$=298 nm relative to that of standard concentrations.

The difference between the amount of MB that was initially added and the amount present in solution as determined by UV-vis spectrophotometry is assumed to be the amount of MB that has been adsorbed onto the surface of the FGS. The surface area of the FGS are then calculated using a value of 2.54 $m^2$ of surface covered per one mg of MB adsorbed.

The FGS preferably have a bulk density of from about 40 to about 0.1 kg/m$^3$. The bulk density includes all values and subvalues therebetween, especially including 0.5, 1, 5, 10, 15, 20, 25, 30, 35 kg/m$^3$.

The FGS typically have an overall carbon to oxygen molar ratio (C:O ratio), as determined by elemental analysis of at least about 1:1, or more preferably, at least about 3:2. Examples of carbon to oxygen ratios include about 3:2 to about 85:15; about 3:2 to about 20:1; about 3:2 to about 30:1; about 3:2 to about 40:1; about 3:2 to about 60:1; about 3:2 to about 80:1; about 3:2 to about 100:1; about 3:2 to about 200:1; about 3:2 to about 500:1; about 3:2 to about 1000:1; about 3:2 to greater than 1000:1; about 10:1 to about 30:1; about 80:1 to about 100:1; about 20:1 to about 100:1; about 20:1 to about 500:1; about 20:1 to about 1000:1. In some embodiments of the invention, the carbon to oxygen ratio is at least about 10:1, or at least about 20:1, or at least about 35:1, or at least about 50:1, or at least about 75:1, or at least about 100:1, or at least about 200:1, or at least about 300:1, or at least about 400:1, or at least 500:1, or at least about 750:1, or at least about 1000:1.

The carbon to oxygen ratio also includes all values and subvalues between these ranges.

The inks used in the present invention may optionally contain additional electrically conductive components other than the functionalized graphene sheets, such as metals (including metal alloys), conductive metal oxides, polymers, carbonaceous materials other than the high surface area functionalized graphene sheets, and metal-coated materials. These components can take a variety of forms, including particles, powders, flakes, foils, needles, etc.

Examples of metals include, but are not limited to silver, copper, aluminum, platinum, palladium, nickel, chromium, gold, bronze, and the like. Examples of metal oxides include antimony tin oxide and indium tin oxide and materials such as fillers coated with metal oxides. Metal and metal-oxide coated materials include, but are not limited to metal coated carbon and graphite fibers, metal coated glass fibers, metal coated glass beads, metal coated ceramic materials (such as beads), and the like. These materials can be coated with a variety of metals, including nickel.

Examples of electrically conductive polymers include, but are not limited to, polyacetylene, polyethylene dioxythiophene, polyaniline, polypyrrole, and the like.

Examples of carbonaceous materials other than the high surface area functionalized graphene sheets include, but are not limited to, carbon black, graphite, carbon nanotubes, vapor-grown carbon nanofibers, carbon fibers, metal coated carbon fibers.

Preferred binders are polymeric binders. Polymeric binders can be thermoplastics or thermosets and may be elastomers. Binders may also comprise monomers that can be polymerized before, during, or after the application of the ink to the substrate. Polymeric binders may be cross-linked or otherwise cured after the ink has been applied to the substrate. Examples of preferred polymeric binders include polyethers such as poly(ethylene oxide)s (also known as poly(ethylene glycol)s, poly(propylene oxide)s (also known as poly(propylene glycol)s, ethylene oxide/propylene oxide copolymers, cellulosic resins (such as ethyl cellulose, ethyl hydroxyethyl cellulose, carboxymethyl cellulose, cellulose acetate, cellulose acetate propionates, and cellulose acetate butyrates), and poly(vinyl butyral), polyvinyl alcohol and its derivatives, ethylene/vinyl acetate polymers, acrylic polymers and copolymers, styrene/acrylic copolymers, styrene/maleic anhydride copolymers, isobutylene/maleic anhydride copolymers, vinyl acetate/ethylene copolymers, ethylene/acrylic acid copolymers, polyolefins, polystyrenes, olefin and styrene copolymers, epoxy resins, acrylic latex polymers, polyester acrylate oligomers and polymers, polyester diol diacrylate polymers, UV-curable resins, and polyamide, including polyamide polymers and copolymers (i.e., polyamides having at least two different repeat units) having melting points between about 120 and 255° C. (such as those sold under the trade names Macromelt by Henkel and Versamid by Cognis).

The inks may optionally comprise one or more carriers in which some or all of the components are dissolved, suspended, or otherwise dispersed or carried. Examples of suitable carriers include, but are not limited to, water, distilled or synthetic isoparaffinic hydrocarbons (such Isopar® and Norpar® (both manufactured by Exxon) and Dowanol® (manufactured by Dow), citrus terpenes and mixtures containing citrus terpenes (such as Purogen, Electron, and Positron (all manufactured by Purogen)), limonene, aliphatic petroleum distillates, alcohols (such as methanol, ethanol, n-propanol, i-propanol, n-butanol, i-butanol, sec-butanol, tert-butanol, diacetone alcohol, butyl glycol, and the like), ketones (such as acetone, methyl ethyl ketone, cyclohexanone, i-butyl ketone, 2,6,8,trimethyl-4-nonanone and the like), esters (such as methyl acetate, ethyl acetate, n-propyl acetate, i-propyl acetate, n-butyl acetate, i-butyl acetate, carbitol acetate, and the like), glycol ethers (such as propylene glycol monomethyl ether and other propylene glycol ethers, ethylene glycol monobutyl ether and other ethylene glycol ethers, ethylene and propylene glycol ether acetates), N-methyl-2-pyrrolidone, and mixtures of two or more of the foregoing and mixtures of one or more of the foregoing with other carriers. Preferred solvents include low- or non-VOC solvents, non-hazardous air pollution solvents, and non-halogenated solvents.

The inks may optionally comprise one or more additional additives, such as dispersion aids (including surfactants, emulsifiers, and wetting aids), adhesion promoters, thickening agents (including clays), defoamers and antifoamers, biocides, additional fillers, flow enhancers, stabilizers, cross-linking and curing agents, and the like. In one embodiment of the present invention, the surfactant is at least one ethylene oxide/propylene oxide copolymer.

The inks may also optionally comprise one or more prepolymers, oligomers, photo-initiators, and additional additives to allow for curing by UV, electron beam, or infra-red radiation.

Examples of dispersing aids include glycol ethers (such as poly(ethylene oxide), block copolymers derived from ethylene oxide and propylene oxide (such as those sold under the trade name Pluronic® by BASF), acetylenic diols (such as 2,5,8,11-tetramethyl-6-dodecyn-5,8-diol ethoxylate and others sold by Air Products under the trade names Surfynol® and Dynol®), salts of carboxylic acids (including alkali metal and ammonium salts), and polysiloxanes.

Examples of grinding aids include stearates (such as Al, Ca, Mg, and Zn stearates) and acetylenic diols (such as those sold by Air Products under the trade names Surfynol® and Dynol®).

Examples of adhesion promoters include titanium chelates and other titanium compounds such as titanium phosphate complexes (including butyl titanium phosphate), titanate esters, diisopropoxy titanium bis(ethyl-3-oxobutanoate, isopropoxy titanium acetylacetonate, and others sold by Johnson-Matthey Catalysts under the trade name Vertec.

Examples of thickening agents include glycol ethers (such as poly(ethylene oxide), block copolymers derived from ethylene oxide and propylene oxide (such as those sold under the trade name Pluronic® by BASF).

The inks are electrically conductive and preferably have a conductivity of at least about $10^{-8}$ S/cm. In one embodiment of the invention, when components of the printed electronic devices made from the inks are used as semiconductors, they preferably have a conductivity of about $10^{-8}$ S/cm to about $10^{3}$ S/cm, or more preferably of about $10^{-7}$ S/cm to about $10^{3}$ S/cm. In another embodiment of the invention, the inks preferably have a conductivity of at least about $10^{2}$ S/cm, or more preferably at least about $10^{3}$ S/cm, or yet more preferably at least about $10^{4}$ S/cm. The conductivities of the inks are determined after they have been applied to the substrate and subjected to any post-application treatments (such drying, curing, cross-linking, etc.).

The FGS are preferably present in the ink in at least about 0.01 weight percent based on the total weight of the ink. In one embodiment of the invention, the FGS are preferably present in the ink in at least about 0.01 weight percent, or more preferably in at least about 0.05 weight percent, or yet more preferably in at least about 0.1 weight percent, or still more preferably in at least about 0.5 weight percent, or even more preferably in at least about 1 weight percent, where the weight percentages are based on the total weight of the ink after it has been applied to the substrate and subjected to any post-application treatments (such drying, curing, cross-linking, etc.). However, as will be appreciated by those skilled in the art, the amount of FGS present in the inks can be selected based on the desired electrical conductivity and the particular binders and other optional components chosen.

The inks preferably contain a sufficient amount of FGS such that they have electrical conductivities that are greater than those of the corresponding materials containing each component of the ink in question except for the FGS.

The inks may be made using any suitable method, including wet or dry methods and batch, semi-continuous, and continuous methods.

For example, components of the inks, such as two or more of the functionalized graphene sheets, binders, carriers, and/or other components may be blended by using suitable mixing, dispersing, and/or compounding techniques and apparatus, including ultrasonic devices, high-shear mixers, two-roll mills, three-roll mills, cryogenic grinding crushers, extruders, kneaders, double planetary mixers, triple planetary mixers, high pressure homogenizers, ball mills, attrition equipment, sandmills, and horizontal and vertical wet grinding mills, and the like.

The resulting blends may be further processed using wet or dry grinding technologies. The technologies can be continuous or discontinuous. Examples include ball mills, attrition equipment, sandmills, and horizontal and vertical wet grinding mills. Suitable materials for use as grinding media include metals, carbon steel, stainless steel, ceramics, stabilized ceramic media (such as yttrium stabilized zirconium oxide), PTFE, glass, tungsten carbide, and the like.

After blending and/or grinding steps, additional components may be added to the inks, including, but not limited to, thickeners, viscosity modifiers, and the like. The inks may also be diluted by the addition of more carrier.

After they have been printed on a substrate, the inks may be cured using any suitable technique, including drying and oven-drying (in air or another inert or reactive atmosphere), UV curing, IR curing, microwave curing or drying, and the like.

The printed electronic devices of the present invention may take on a variety of forms. They may contain multiple layers of electronic components (e.g. circuits) and/or substrates. All or part of the printed layer(s) may be covered or coated with another material such as a cover coat, varnish, cover layer, cover films, dielectric coatings, electrolytes and other electrically conductive materials, and the like. There may also be one or more materials between the substrate and printed circuits. Layers may include semiconductors, metal foils, and dielectric materials.

The printed electronics may further comprise additional components, such as processors, memory chips, other microchips, batteries, resistors, diodes, capacitors, transistors, and the like.

The printed electronic devices may take on a wide variety of forms and be used in a large array of applications. Examples include but are not limited to: passive and active devices and components; electrical and electronic circuitry, integrated circuits; flexible printed circuit boards; transistors; field-effect transistors; microelectromechanical systems (MEMS) devices; microwave circuits; antennas; indicators; chipless tags (e.g. for theft deterrence from stores, libraries, and the like); smart cards; sensors; liquid crystalline displays (LCDs); signage; lighting; flat panel displays; flexible displays, including light-emitting diode, organic light-emitting diode, and polymer light-emitting diode displays; backplanes and frontplanes for displays; electroluminescent and OLED lighting; photovoltaic devices—backplanes; product identifying chips and devices; batteries, including thin film batteries; electrodes; indicators; printed circuits in portable electronic devices (for example, cellular telephones, computers, personal digital assistants, global positioning system devices, music players, games, calculators, and the like); electronic connections made through hinges or other movable/bendable junctions in electronic devices such as cellular telephones, portable computers, folding keyboards, and the like); wearable electronics; and circuits in vehicles, medical devices, diagnostic devices, instruments, and the like.

Preferred electronic devices are radiofrequency identification (RFID) devices and/or components thereof and/or radiofrequency communication device. Examples include, but are not limited to, RFID tags, chips, and antennas. The RFID devices may be ultrahigh frequency RFID devices, which typically operate at frequencies in the range of about 868 to about 928 MHz. Examples of uses for RFIDs are for tracking shipping containers, products in stores, products in transit, and parts used in manufacturing processes; passports; barcode replacement applications; inventory control applications; pet identification; livestock control; contactless smart cards; automobile key fobs; and the like.

EXAMPLES

General Details for Examples 1-3 and Comparative Example 1

Graphite oxide is prepared from graphite by treatment with sulfuric acid, nitric acid, and potassium chlorate and then thermally exfoliated to form FGS according to the methods disclosed in Staudenmaier, L. *Ber. Stsch. Chem. Ges.* 1898, 31, 1481 and Schniepp, H. C. et al. *J. Phys. Chem. B.* 2006, 110, 8535-8539 (and its Supporting Information) and McAllister, M. J. et al. *Chem. Materials* 2007 19 4396-4404.

The inks are prepared as follows. A poly(ethylene oxide) (PEO) solution is prepared by mixing a sufficient amount of PEO with a 1:1 volume/volume mixture of ethanol and deionized water to produce a mixture containing 40 mg of PEO per mL of total solvent. After stirring overnight, a homogeneous PEO stock solution is obtained.

FGS is weighed and a sufficient amount of concentrated aqueous Pluronic® F127 (an ethylene oxide/propylene oxide copolymer surfactant supplied by BASF) solution (typically 2 mg/mL) is added to the FGS to yield a mixture having a 1:1 weight ratio of FGS and Pluronic F127. Sufficient de-ionized water is added to produce a suspension containing 1 mg FGS per 1 ml of water. The resulting suspension is sonicated for 5 minutes with a duty cycle of 20 percent in an ice bath. 1 mL of the FGS suspension is then added to 3 mL of the PEO stock solution and the mixture is stirred for 3-5 minutes until homogeneous.

Example 1

An ink is prepared as described above using PEO having a molecular weight of 4,000,000. The ink is printed electrohydrodynamically onto a glass substrate using the method disclosed in WO 2007/053621. The printing is done at a flow rate of 0.5 mL/hr under a 2200 kV potential difference between electrodes that are 7.2 mm apart. The width of the lines is about 43 μm. FIG. 1 is an optical microscope image of a series of parallel printed lines.

Copper tapes are attached to the lines perpendicular to the length of the lines. A power supply (Tektronix PS 252G Programmable Power Supply, Tektronix Inc., Beaverton, Oreg.) and a multimeter (Fluke 27 Multimeter, Fluke Corp., Everett, Wash.) are attached in serial with the printed via the copper tapes. A potential difference (5-20 V) is applied and current is monitored through the multimeter. An electrometer (Keithley 6514, Keithley Instruments Inc., Cleveland, Ohio) with two electrodes is used to measure the potential difference across two points along the direction of the current. The potential difference measured on the film and current is used to find the resistance using Ohm's law, i.e. R=V/I; where R, V, and I are the resistance, voltage, and current, respectively. Resistivity ($\sigma$) is found by $\sigma$=RA/L, where A and L are the cross section of the film through which current flows and the length over which the potential difference is measured. Conductivity (K) is found by $\kappa=1/\sigma$. The resulting conductivity is about 0.05 S/m.

Example 2

An ink is prepared as described above using PEO having a molecular weight of 4,000,000. The ink is printed electrohydrodynamically onto a glass substrate using the method disclosed in WO 2007/053621. The printing is done at a flow rate of 0.5 mL/hr under a 2200 kV potential difference between electrodes that are 7.2 mm apart. The width of the lines is about 130 μm.

The ink is formed into a film as follows: two copper plates (22 mm×22 mm) are wrapped with Teflon tape, leaving 1 mm of copper uncovered at the lower ends. The plates are then firmly attached to the shorter of the side walls of a Teflon® cell (23 mm×46 mm inner base area, 32 mm height) with screws. The mixture is poured into the Teflon® cell and kept at 50° C. on a hot plate until all of the solvent is evaporated to form films that are attached to the copper plates.

Copper tapes are attached parallel to each other on two ends of the film such that they cover the entire width of the film. The electrical conductivity of the film is measured across the copper tapes as described above for Example 1. The measured conductivity is about 12.4 S/m.

Comparative Example 1

An ink is prepared as described above substituting carbon black (supplied by Cabot Corp.) for the FGS and using PEO having a molecular weight of 300,000. The ink is printed electrohydrodynamically onto a glass substrate using the method disclosed in WO 2007/053621. The printing is done at a flow rate of 0.5 mL/hr under a 2200 kV potential difference between electrodes that are 7.2 mm apart. The width of the lines is about 130 μm.

As described above for Example 2, the ink is formed into a film and its electrical conductivity is measured. The result is about $1.3 \times 10^{-8}$ S/m.

Example 3

An ink is prepared as described above using PEO having a molecular weight of 4,000,000. The ink is printed electrohydrodynamically onto a glass substrate using the method disclosed in WO 2007/053621. The printing is done at a flow rate of 0.5 mL/hr under a 2200 kV potential difference between electrodes that are 7.2 mm apart. The width of the lines is about 140 μm and the thickness is about 300 nm. The printed line has an electrical conductivity of about 19.6 S/m.

General Details for Examples 4-14

Preparation of Test Samples

The inks in the form of liquid dispersions are printed onto a substrate using a doctor blade and then dried in air in an oven at 125° C. to form a film. Testing is done on the printed films.

Electrical Conductivity

The point-to-point resistivity (in ohms) of the films is measured using a standard multimeter across contact points consisting of two spots of silver paste having a diameter of about 0.3 mm that are applied to the surface of the film about 1 inch apart. The resistance across these points is also measured using a standard multimeter and the reading is divided by 10 to calculate the resistivity in ohms/square. Results given as a single number are an average of several measurements and results given as a range of figures indicate the high and low readings from several measurements.

Peel Resistance

A fingernail is drawn back and forth across the surface of the film five times. The surface of the film where it was scratched and the tip of the nail are examined and the scratch resistance of the film is assessed as follows: excellent is no noticeable transfer of the film surface to the nail; very good is minimal transfer and no noticeable indentation on the surface of the film; good is some indentation of the film surface; fair is removal of a substantial portion of the film; and poor is where the substrate is visible. In some cases no cohesive film adhered to the substrate is formed.

Scratch Resistance

A fingernail is drawn across the surface of the film. The film and tip of the nail are visually inspected. The scratch resistance is graded as follows: no transfer of film material to the finger nail=excellent; about 10 percent transfer=very good; about 20 percent transfer=good/very good; about 30 percent transfer=good; about 40 percent transfer=fair/good; about 50 percent transfer=fair; about 65 percent transfer=poor/fair; about 85 percent transfer=poor; and about 100 percent transfer (the substrate is fully visible and very little to no printed material remains)=very poor.

Ink Preparation Methods

Ball mill A: An Eiger Mini 250 Type M250-VSE-TEFV horizontal grinding mill

Ball mill B: A vertical stainless steel vertical grinding mill having four stainless steel arms situated 90° away from each other. The mill is driven by a compressed air motor and has a bottom discharge valve.

High shear mixer: A homogenizer having a roto-stator overhead stirrer.

Ingredients used in the formulations:

Electron and Positron are citrus terpene-based solvents supplied by Ecolink, Tucker GA.

Example 4

A 4.9 weight percent aqueous solution of poly(ethylene oxide) (PEO) having an average molecular weight of 600,000 (236.2 g) is combined with FGS having a 0:0 ratio of approximately 100:1 (2.4 g), ethylene oxide/propylene oxide copolymer surfactant (Pluronic F127, supplied by BASF) (2.4 g), antifoaming agent (AF 204, supplied by Sigma) (0.3 g), and water (50 g). The mixture is ground in ball mill B at 650 rpm using 3/16" stainless steel balls as a grinding medium for 6 hours. The resulting dispersion is printed onto thermally stabilized PET, coated paper, and uncoated paper and the adhesion properties and electrically resistivity of the resulting printed films are measured. The results are given in Table 1.

Example 5

A 10.8 weight percent aqueous solution of poly(ethylene oxide) (PEO) having an average molecular weight of 600,000 (110.8 g) is combined with FGS having a C:O ratio of approximately 100:1 (2.4 g), surfactant (Surfynol 104H, supplied by Air Products) (2.4 g), antifoaming agent (AF 204, supplied by Sigma) (0.2 g), and water (134.2 g). The mixture is ground in ball mill B at 693 rpm using 3/16" stainless steel balls as a grinding medium for six hours. The resulting dispersion is printed onto to thermally stabilized PET, coated paper, and uncoated paper and the adhesion properties and electrically resistivity of the resulting printed films are measured. The results are given in Table 1.

TABLE 1

| | Thermally stabilized PET | | Coated Paper | | Uncoated paper | |
|---|---|---|---|---|---|---|
| | Peel resistance | Resistivity ($\Omega$/sq.) | Peel resistance | Resistivity ($\Omega$/sq.) | Peel resistance | Resistivity ($\Omega$/sq.) |
| Example 4 | Good | 5-10 | Fair/good | 7-10 | Poor | 4-5 |
| Example 5 | Fair/good | 10 | Fair/good | 8-12 | Poor | 6-7 |

Examples 6-12

In the case of Examples 6-10, a 20 weight percent solution of polyamide binder (Versamid 750, supplied by Cognis) in isopropyl alcohol (200 g) is combined with FGS having a C:O ratio of approximately 100:1 (10 g) and additional isopropyl alcohol (40 g). In the case of Examples 18 and 19, a 20 weight percent solution of polyamide binder (Versamid 750, supplied by Cognis) in isopropyl alcohol (70 g) is combined with FGS having a 0:0 ratio of approximately 100:1 (6 g) and additional isopropyl alcohol (124 g).

In all cases, the resulting suspensions are ground for 1.5 hours at 100° F. in ball mill A at 5000 rpm for 1.5 hours using 0.3 mm 5% yttrium stabilized zirconium oxide as the grinding medium. In the cases of Examples 7 and 10, BYK-ES80 (an alkylolammonium salt of an unsaturated acidic carboxylic acid ester supplied by BYK USA, Wallingford, Conn.) (0.2 g) is added to 10 g of the resulting dispersion. In the cases of Examples 9 and 12, a 10 weight percent solution of polyaniline (PANI) (Panipol F, supplied by Panipol Oy, Porvoo, Finland) in chloroform (2 g) is added to 10 g of the resulting dispersion. After each of these additives is added, the resulting mixture is blended for about a minute in the high shear mixer. In each case the resulting dispersion is printed onto thermally stabilized PET and the adhesion properties and electrical resistivity of the printed films are measured. The results are given in Table 2.

TABLE 2

| | Additive | Peel resistance | Scratch resistance | Resistivity ($\Omega$/sq.) |
|---|---|---|---|---|
| Example 6 | none | Excellent | Excellent | 15 |
| Example 7 | BYK | Very good | Very good | 12 |
| Example 8 | none | Excellent | Excellent | 18-23 |
| Example 9 | PANI | Excellent | Excellent | 15-25 |
| Example 10 | BYK | Excellent | Excellent | 15 |
| Example 11 | none | Excellent | Excellent | 20 |
| Example 12 | PANI | Good | Good | 17 |

The invention claimed is:

1. A method of making a printed electronic device comprising a substrate having at least one surface, comprising applying a layer of an electrically conductive ink to at least a portion of the surface,
   wherein the electrically conductive ink comprises functionalized graphene sheets and at least one binder, and
   wherein the ink is applied using one or more methods selected from the group consisting of syringe deposition, spray coating, electrospray deposition, ink-jet printing, spin coating, thermal transfer, laser transfer methods, screen printing, rotary screen printing, gravure printing, capillary printing, offset printing, electrohydrodynamic (EHD) printing, flexographic printing, pad printing, stamping, xerography, microcontact printing, dip pen nanolithography, laser printing, and by pen.

2. The method of claim 1, wherein the substrate comprises one or more substrates selected from the group consisting of polymers, pulp products; synthetic papers, fabrics and textiles, metals, woods, glass, minerals, silicon, semiconductors, ceramics, and laminates.

3. The method of claim 1, wherein the ink is applied by screen printing.

4. The method of claim 1, wherein the ink is applied by flexographic printing.

5. The method of claim 1, wherein the ink has an electrical conductivity of at least about $10^{-8}$ S/cm.

6. The method of claim 1, wherein the ink has an electrical conductivity of at least about $10^2$ S/cm.

7. The method of claim 1, wherein the ink has an electrical conductivity of at least about $10^4$ S/cm.

8. The method of claim 1, wherein the ink has an electrical conductivity of at least about $10^{-7}$ S/cm to about $10^3$ S/cm.

9. The method of claim 1, wherein the functionalized graphene sheets have a surface area of from about 300 to about 2630 $m^2$/g.

10. The method of claim 1, wherein the functionalized graphene sheets have a surface area of from about 400 to about 2630 $m^2$/g.

11. The method of claim 1, wherein the functionalized graphene sheets have a surface area of from about 500 to about 2630 $m^2$/g.

12. The method of claim 1, wherein the functionalized graphene sheets have a carbon to oxygen molar ratio of about 20:1 to about 500:1.

13. The method of claim 1, wherein the functionalized graphene sheets have a carbon to oxygen molar ratio of at least about 10:1.

14. The method of claim 1, wherein the functionalized graphene sheets have a carbon to oxygen molar ratio of at least about 50:1.

15. The method of claim 1, wherein the binder is a polymeric binder consisting of one or more selected from the group consisting of polyethers, cellulosic resins, poly(vinyl butyral), polyvinyl alcohol and its derivatives, ethylene/vinyl acetate polymers, acrylic polymers and copolymers, styrene/acrylic copolymers, styrene/maleic anhydride copolymers, isobutylene/maleic anhydride copolymers, vinyl acetate/ethylene copolymers, ethylene/acrylic acid copolymers, polyolefins, polystyrenes, olefin and styrene copolymers, epoxy resins, acrylic latex polymers, polyester acrylate oligomers and polymers, polyester diol diacrylate polymers, UV-curable resins, and polyamide polymers and copolymers.

16. The method of claim 15 wherein the binder is one or more of cellulosic resins, poly(vinyl butyral), acrylic polymers and copolymers, and epoxy resins.

17. A printed electronic device made by the method of claim 1.

18. The device of claim 17 in the form of a radiofrequency identification device and/or a radiofrequency device antenna.

19. The device of claim 17 in the form of antennas, product identifying chips and devices, batteries, electrodes, or vehicle circuits.

20. The device of claim 17 in the form of a wearable electronic device.

\* \* \* \* \*